United States Patent
Nakanishi et al.

(10) Patent No.: US 9,045,717 B2
(45) Date of Patent: Jun. 2, 2015

(54) CLEANING AGENT FOR SEMICONDUCTOR PROVIDED WITH METAL WIRING

(75) Inventors: Mutsumi Nakanishi, Kyoto (JP); Hiroshi Yoshimochi, Kyoto (JP); Yukichi Koji, Tokyo (JP)

(73) Assignee: ADVANCED TECHNOLOGY MATERIALS, INC., Danbury, CT (US)

( * ) Notice: Subject to any disclaimer, the term of this patent is extended or adjusted under 35 U.S.C. 154(b) by 260 days.

(21) Appl. No.: 13/575,452

(22) PCT Filed: Jan. 28, 2011

(86) PCT No.: PCT/US2011/022961
§ 371 (c)(1),
(2), (4) Date: Oct. 15, 2012

(87) PCT Pub. No.: WO2011/094568
PCT Pub. Date: Aug. 4, 2011

(65) Prior Publication Data
US 2013/0203643 A1 Aug. 8, 2013

(30) Foreign Application Priority Data

Jan. 29, 2010 (JP) ................................. 2010-017772
Mar. 26, 2010 (JP) ................................. 2010-072824

(51) Int. Cl.
| C11D 7/32 | (2006.01) |
| C11D 3/00 | (2006.01) |
| C11D 7/06 | (2006.01) |
| C11D 7/26 | (2006.01) |
| C11D 11/00 | (2006.01) |
| H01L 21/02 | (2006.01) |

(52) U.S. Cl.
CPC ............ *C11D 7/3281* (2013.01); *C11D 3/0042* (2013.01); *C11D 7/06* (2013.01); *C11D 7/265* (2013.01); *C11D 7/267* (2013.01); *C11D 7/3209* (2013.01); *C11D 7/3218* (2013.01); *C11D 11/0047* (2013.01); *H01L 21/02074* (2013.01)

(58) Field of Classification Search
CPC .... C11D 11/0047; C11D 3/30; C11D 7/3209; C11D 7/3218
See application file for complete search history.

(56) References Cited

U.S. PATENT DOCUMENTS

| 6,194,366 | B1 | 2/2001 | Naghshineh et al. |
| 6,465,403 | B1 | 10/2002 | Skee |
| 6,492,308 | B1 | 12/2002 | Naghshineh et al. |
| 6,585,825 | B1 * | 7/2003 | Skee ................. 134/3 |
| 6,627,587 | B2 | 9/2003 | Naghshineh et al. |
| 6,723,691 | B2 | 4/2004 | Naghshineh et al. |
| 7,365,045 | B2 | 4/2008 | Walker et al. |
| 7,923,423 | B2 | 4/2011 | Walker et al. |
| 7,968,507 | B2 * | 6/2011 | Lee et al. ........... 510/175 |
| 2001/0004633 | A1 | 6/2001 | Naghshineh et al. |
| 2005/0014667 | A1 * | 1/2005 | Aoyama et al. ..... 510/175 |
| 2005/0176259 | A1 | 8/2005 | Yokoi et al. |
| 2005/0205835 | A1 | 9/2005 | Tamboli et al. |
| 2006/0040838 | A1 * | 2/2006 | Shimada et al. ..... 510/175 |
| 2006/0046490 | A1 | 3/2006 | Banerjee et al. |
| 2007/0225186 | A1 | 9/2007 | Fisher |
| 2008/0004197 | A1 * | 1/2008 | Kneer ............... 510/245 |
| 2008/0076688 | A1 | 3/2008 | Barnes et al. |
| 2009/0061630 | A1 | 3/2009 | Palmer et al. |
| 2009/0118153 | A1 * | 5/2009 | Rath et al. ......... 510/176 |
| 2009/0120457 | A1 | 5/2009 | Naghshineh et al. |
| 2009/0239777 | A1 | 9/2009 | Angst et al. |
| 2010/0056410 | A1 | 3/2010 | Visintin et al. |
| 2010/0286014 | A1 | 11/2010 | Barnes |
| 2012/0028870 | A1 | 2/2012 | Barnes et al. |
| 2012/0283163 | A1 * | 11/2012 | Barnes et al. ..... 510/175 |

FOREIGN PATENT DOCUMENTS

| JP | 2002299300 | 10/2002 |
| JP | 2003292993 | 10/2003 |
| JP | 2004029696 | 1/2004 |
| JP | 2005307187 | 11/2005 |
| JP | 2009013417 | 1/2009 |
| JP | 2009531511 | 9/2009 |
| JP | 2009239206 | 10/2009 |
| WO | 2010048139 A2 | 4/2010 |

OTHER PUBLICATIONS

Japanese Office Action, Dec. 6, 2013.
Japanese Office Action, Mar. 12, 2014.
International Search Report, Oct. 24, 2011.

* cited by examiner

*Primary Examiner* — Gregory Webb
(74) *Attorney, Agent, or Firm* — Tristan A. Fuierer; Moore & Van Allen, PLLC; Rosa Yaghmour

(57) ABSTRACT

A cleaning agent for a microelectronic device provided with metal wiring, which has an excellent ability to remove polishing particle residues derived from a polishing agent and an excellent ability to remove metallic residues on an insulating film, and has excellent anticorrosiveness to the metal wiring. The cleaning agent is used at a step subsequent to chemical mechanical polishing in a manufacturing process of a microelectronic device in which a metal wiring, e.g., copper or tungsten, is formed.

15 Claims, No Drawings

CLEANING AGENT FOR SEMICONDUCTOR PROVIDED WITH METAL WIRING

CROSS-REFERENCE TO RELATED APPLICATIONS

This application is filed under the provisions of 35 U.S.C. §371 and claims the priority of International Patent Application No. PCT/US2011/022961 filed on 28 Jan. 2011 and entitled "Cleaning Agent for Semiconductor Provided with Metal Wiring" which claims priority to Japanese Patent Application No. 2010-017772 filed on 29 Jan. 2010 and Japanese Patent Application No. 2010-072824 filed on 26 Mar. 2010, all of which are hereby incorporated herein by reference in their entireties.

FIELD

The present invention relates to a cleaning agent used for cleaning a surface subsequent to chemical mechanical polishing (CMP) in a manufacturing process of a microelectronic device, and particularly relates to a post-CMP cleaning agent for a microelectronic device provided with metal wiring (e.g., tungsten or a tungsten alloy, copper or a copper alloy) on the surface thereof.

BACKGROUND

Market needs such as high performance and miniaturization has resulted in the need for more integrated semiconductor elements on microelectronic devices. For example, a high-level planarization technique for forming a finer circuit pattern is necessary, wherein a CMP step of polishing a wafer surface using a polishing slurry (hereinafter, abbreviated to a CMP slurry) containing particulates of alumina or silica is effectuated.

In this CMP step, however, various substances remain on the device after polishing, for example: polishing particulates such as alumina and silica in the CMP slurry (hereinafter, abrasive grains), iron nitrate aqueous solutions added to accelerate polishing, anticorrosive added to suppress corrosion of a metal, and residues of a polished metal wiring and zinc and magnesium metals used on a side of said metal wiring. These residues can have an adverse effect on electrical properties of the semiconductor such as shorting. Accordingly, it is necessary to remove these residues prior to proceeding to the next manufacturing step.

In the related art for tungsten CMP, post-CMP methods typically use an ammonia and hydrogen peroxide aqueous solution or a hydrochloric acid and hydrogen peroxide aqueous solution in combination with a diluted hydrofluoric acid aqueous solution. In such a method, however, the wiring metal can be substantially corroded. Accordingly, the method cannot be applied to modern microelectronic devices having fine patterns. In order to avoid this corrosion, a cleaning process using a cleaning agent containing an organic acid that is less corrosive to tungsten, such as citric acid and oxalic acid, and a chelating agent such as amino polycarboxylic acid has been proposed (Japanese Patent Application Laid-Open No. 10-72594).

In the related art for copper CMP, post-CMP methods typically use acidic cleaning agents containing an organic acid such as citric acid and oxalic acid as a principal component (Japanese Patent Application Laid-Open No. 2001-7071). However, while these cleaning agents have an excellent ability to remove metallic residues, the cleaning agents are highly corrosive to the copper wiring. In order to improve this corrosiveness, alkaline cleaning agents containing an alkanolamine as a principal component are known (Japanese Patent Application Laid-Open No. 11-74243). These cleaning agents have low corrosivity to the copper wiring and have an excellent ability to remove organic residues derived from the anticorrosive added in the CMP slurry. That said, these cleaning agents have a poor ability to remove metallic residues. Alternatively, alkaline cleaning agents having an ability to remove metallic residues are known, said cleaning agents including an organic acid, such as succinic acid and oxalic acid, and an alkanolamine as the principal component (Japanese Unexamined Patent Application Publication No. 2003-536258). However, while these cleaning agents have an excellent ability to remove metallic and organic residues, the cleaning agents are highly corrosive to the copper wiring. Accordingly, such cleaning agents cannot be applied to modern microelectronic devices having fine patterns.

SUMMARY

An object of the present invention is to provide a cleaning agent for a microelectronic device provided with metal wiring (e.g., tungsten, tungsten alloy, copper or copper alloy), which has an excellent ability to remove material (e.g., abrasive grains in a CMP slurry such as alumina and silica, an iron nitrate aqueous solution added to accelerate polishing, an anticorrosive added to suppress corrosion of a wiring metal, and residues of a metal wiring and zinc and magnesium metals used on a side of the metal wiring) that remains on a wafer subsequent to a CMP step without corroding the metal wiring.

Namely, the present invention is a cleaning agent for post-CMP cleaning of a microelectronic device in which a metal wiring is formed, wherein the metal wiring comprising copper or tungsten. In one aspect, the cleaning agent comprises an organic amine (A), a quaternary ammonium hydroxide (B), a chelating agent (C), and water (W), and has a pH of 7.0 to 14.0. In another aspect, the cleaning agent comprises a cyclic polyamine (A1) and/or a cyclic polyamine (A2), a polyphenol based reducing agent (B) having 2 to 5 hydroxyl groups, a quaternary ammonium hydroxide (C), ascorbic acid (D), and water.

The cleaning agent for a microelectronic device provided with tungsten or tungsten alloy wiring has an excellent ability to remove abrasive grains derived from a polishing slurry, an excellent ability to remove metallic residues from an insulating layer, and excellent anticorrosiveness to the tungsten wiring.

The cleaning agent for a microelectronic device provided with copper or copper alloy wiring has an excellent ability to remove abrasive grains derived from a polishing slurry, an excellent ability to remove metallic residues from an insulating layer, and excellent anticorrosiveness to the copper wiring.

Moreover, a microelectronic device having good contact resistance without shorting is easily obtained using the cleaning agents described herein at the step subsequent to the CMP step in the manufacturing process of the microelectronic device.

Other aspects, features and advantages will be more fully apparent from the ensuing disclosure and appended claims.

DETAILED DESCRIPTION OF THE PREFERRED EMBODIMENTS

For ease of reference, "microelectronic device" corresponds to semiconductor substrates, flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" is not meant to be limiting in any way and includes any substrate that will eventually become a microelectronic device or microelectronic assembly.

As used herein, "material" corresponds to post-CMP residue and/or contaminants. As used herein, "contaminants" correspond to chemicals present in the CMP slurry, reaction by-products of the polishing slurry, and any other materials that are the by-products of the CMP process, including but not limited to, an iron nitrate aqueous solution added to accelerate polishing, and an anticorrosive added to suppress corrosion of a wiring metal. As used herein, "post-CMP residue" corresponds to particles from the polishing slurry, e.g., silica-containing particles, alumina-containing particles, residues of a metal wiring and zinc and magnesium metals used on a side of the metal wiring, chemicals present in the slurry, reaction by-products of the polishing slurry, carbon-rich particles, polishing pad particles, brush deloading particles, equipment materials of construction particles, copper, copper oxides, organic residues, and any other materials that are the by-products of the CMP process.

In a first aspect, a first composition useful for the removal of material remaining on a microelectronic device subsequent to CMP is described, said first composition comprising, consisting of, or consisting essentially of an organic amine (A), a quaternary ammonium hydroxide (B), a chelating agent (C), and water (W), wherein the cleaning agent has a pH of 7.0 to 14.0. The first composition is particularly useful for the removal of material remaining on a microelectronic device comprising tungsten or tungsten alloy, preferably subsequent to the CMP of tungsten or tungsten alloy layers.

Examples of the organic amine (A) include chain amines, cyclic amines, or any combination thereof. Examples of the chain amines include chain monoamines, chain polyamines, or any combination thereof. Examples of the chain monoamines include chain alkyl monoamines having 1 to 6 carbon atoms, and chain alkanolamines having 2 to 6 carbon atoms (A1). Examples of the chain alkylamines having 1 to 6 carbon atoms include alkylamines (e.g., methylamine, ethylamine, propylamine, isopropylamine, butylamine, hexylamine), dialkylamines (e.g., dimethylamine, ethylmethylamine, propylmethylamine, butylmethylamine, diethylamine, propylethylamine, diisopropylamine), trialkylamines (e.g., trimethylamine, ethyldimethylamine, diethylmethylamine, triethylamine, tri-n-propylamine, tri-n-butylamine), or any combination thereof. Examples of the chain alkanolamines having 2 to 6 carbon atoms (A1) include monoethanolamine (MEA), diethanolamine, triethanolamine, dimethylaminoethanol, diethylaminoethanol, 2-amino-2-methyl-1-propanol, N-(aminoethyl)ethanolamine, N,N-dimethyl-2-aminoethanol, 2-(2-aminoethoxy)ethanol, or any combination thereof. Examples of the chain polyamines (A2) include alkylene diamines having 2 to 5 carbon atoms, polyalkylene polyamines having 2 to 6 carbon atoms, or any combination thereof. Examples of the alkylene diamines having 2 to 5 carbon atoms include ethylenediamine, propylenediamine, trimethylenediamine, tetramethylenediamine, hexamethylenediamine, or any combination thereof. Examples of diamines having an alkyl group substituted by a hydroxyl group include 2-hydroxyethylaminopropylamine and diethanolaminopropylamine. Examples of polyalkylene polyamines having 2 to 6 carbon atoms include diethylenetriamine, triethylenetetramine, tetraethylenepentamine (TEP), hexamethyleneheptamine, iminobispropylamine, bis(hexamethylene)triamine, pentaethylenehexamine, or any combination thereof. Examples of the cyclic amines include aromatic amines and alicyclic amines, and specifically include C6 to C20 aromatic amines (e.g., aniline, phenylenediamine, tolylenediamine, xylylenediamine, methylenedianiline, diphenyletherdiamine, naphthalenediamine, anthracenediamine); C4 to C15 alicyclic amines (e.g., isophoronediamine, and cyclohexylenediamine); C4 to C15 heterocyclic amines (e.g., piperazine, N-aminoethylpiperazine, and 1,4-diaminoethylpiperazine), or any combination thereof.

Of these organic amines (A), an alkanolamine (A1) represented by the following general formula (1) and a chain polyamine (A2) represented by the following general formula (2) are preferable from the viewpoint of anticorrosiveness to tungsten and an ability to remove abrasive grains. From the viewpoint of an ability to remove metallic residues, the chain polyamines are more preferable, and tetraethylenepentamine is particularly preferable.

Formula 1

(1)

wherein $R^1$ to $R^3$ each independently represent a hydrogen atom or an alkyl group that may be partially substituted by a hydroxyl group; and at least one of $R^1$ to $R^3$ represents an alkyl group substituted by a hydroxyl group.

Formula 2

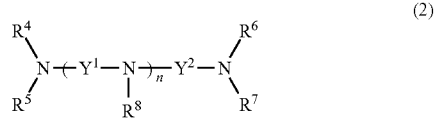

(2)

wherein $R^4$ to $R^8$ each independently represent a hydrogen atom or an alkyl group that may be partially substituted by a hydroxyl group; $Y^1$ and $Y^2$ each independently represent an alkylene group; and n represents 0 or an integer of 1 to 2.

From the viewpoint of an ability to remove metals and anticorrosiveness to tungsten, the content of the organic amine (A) used in the first composition useful for removing material from a microelectronic device provided with tungsten wiring is 0.01 to 0.3% by weight, based on the total weight of the first composition. The content of the organic amine (A) is preferably 0.03 to 0.25% by weight, more preferably 0.05 to 0.2% by weight, and particularly preferably 0.07 to 0.15% by weight, based on the total weight of the first composition.

Examples of the quaternary ammonium hydroxide (B) include tetraalkylammonium salts, trialkylhydroxyalkylammonium salts, dialkyl-bis(hydroxyalkyl)ammonium salts, tris(hydroxyalkyl)alkylammonium salts, or any combination thereof. Of these quaternary ammonium hydroxides (B), the quaternary ammonium hydroxide (B1) represented by the following general formula (3) is preferable from the viewpoint of an ability to remove abrasive grains.

Formula 3

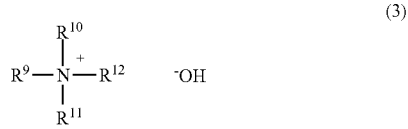

(3)

wherein $R^9$ to $R^{12}$ each independently represent an alkyl group having 1 to 3 carbon atoms and that may be partially substituted by a hydroxyl group. Specific examples thereof include tetraalkylammonium hydroxide, (hydroxyalkyl)trialkylammonium hydroxide, bis(hydroxyalkyl)dialkylammonium hydroxide, and tris(hydroxyalkyl)alkylammonium hydroxide. From the viewpoint of anticorrosiveness to tungsten, tetraalkylammonium hydroxide and (hydroxyalkyl)trialkylammonium hydroxide are preferable, tetramethylammonium hydroxide (TMAH), tetraethylammonium hydroxide (TEAH), and (hydroxyethyl)trimethylammonium hydroxide(choline) are more preferable, and tetramethylammonium hydroxide is particularly preferable.

From the viewpoint of an ability to remove abrasive grains and anticorrosiveness to tungsten, the content of the quaternary ammonium hydroxide (B) used in the first composition useful for removing material from a microelectronic device provided with tungsten wiring is 0.005 to 10% by weight, based on the total weight of the first composition. The content of the quaternary ammonium hydroxide (B) is preferably 0.01 to 2% by weight, and more preferably 0.02 to 1% by weight, based on the total weight of the first composition.

From the viewpoint of an ability to remove metallic residues and an ability to remove abrasive grains, a molar ratio of the quaternary ammonium hydroxide (B) to the organic amine (A), (B)/(A), is preferably 0.1 to 5.0, and more preferably 0.5 to 2.0.

Examples of the chelating agent (C) include phosphorus based chelating agents (C1), amine based chelating agents (C2), aminocarboxylic acid based chelating agents (C3), carboxylic acid based chelating agents (C4), ketone based chelating agents (C5), polymer chelating agents (C6), or any combination thereof. Examples of the phosphorus based chelating agents (C1) include sodium pyrophosphate, sodium tripolyphosphate, potassium trimetaphosphate, sodium tetrametaphosphate, 1-hydroxyethylidene-1,1-diphosphonic acid, or any combination thereof. Examples of the amine based chelating agents (C2) include ethylenediamine, triethylenetetramine, tetraethylenepentamine, dimethylglyoxime, 8-oxyquinoline, porphyrin, or any combination thereof. Examples of the aminocarboxylic acid based chelating agents (C3) include ethylenediamine diacetate and neutralized products of metal salts thereof (the metal is sodium, and potassium, for example), ethylenediamine tetraacetate (EDTA) and neutralized products of metal salts thereof, hexylenediamine diacetate and neutralized products of metal salts thereof, hydroxyethylimino diacetate and neutralized products of metal salts thereof, trisodium nitrilotriacetate, trisodium hydroxyethylethylenediaminetriacetate (HEDTA), pentasodium diethylenetriaminepentaacetate, hexasodium triethylenetetraminehexaacetate, dihydroxyethyl glycine, glycine, tetrasodium L-glutamate diacetate, or any combination thereof. Examples of the carboxylic acid based chelating agents (C4) include oxalic acid, disodium malate, ethylene dicarboxylic acid, adipic acid, sebacic acid, gluconic acid, sodium gluconate, or any combination thereof. Examples of the ketone based chelating agents (C5) include acetylacetone, hexane-2,4-dione, 3-ethylnonane-4,7-dione, or any combination thereof. Examples of the polymers chelating agents (C6) include sodium polyacrylate and poly[2-hydroxyacrylate sodium].

Of these chelating agents (C), from the viewpoint of an ability to remove metallic residues, the amine based chelating agents (C2), the aminocarboxylic acid based chelating agents (C3), and the carboxylic acid based chelating agents (C4) are preferable, and the aminocarboxylic acid based chelating agents (C3) are more preferable. Of the aminocarboxylic acid based chelating agents (C3), ethylenediamine tetraacetate, hexylenediamine diacetate, and hydroxyethylimino diacetate are particularly preferable.

From the viewpoint of anticorrosiveness to tungsten and an ability to remove metallic residues, the content of the chelating agent (C) used in the first composition useful for removing material from a microelectronic device provided with tungsten wiring is 0.0001 to 0.2% by weight, based on the total weight of the first composition. The content of the chelating agent (C) is preferably 0.0005 to 0.1% by weight, and particularly preferably 0.001 to 0.05% by weight, based on the total weight of the first composition.

From the viewpoint of anticorrosiveness to tungsten and an ability to remove metallic residues, a molar ratio of the chelating agent (C) to the organic amine (A), (C)/(A), is preferably 0.001 to 5, more preferably 0.003 to 3, and particularly preferably 0.005 to 1.

In the first composition useful for removing material from a microelectronic device provided with tungsten wiring, water (W) is present, preferably water having low conductivity (μS/cm; 25° C.). Specifically, the conductivity thereof is usually about 0.055 to about 0.2, preferably about 0.056 to about 0.1, and more preferably about 0.057 to about 0.08 from the viewpoint of an ability to remove metallic residues, availability, and prevention of the tungsten wiring from recontamination (i.e., reattachment of metal ions in the composition to the tungsten wiring). Ultrapure water is preferable.

The pH at 25° C. of the first composition is about 7.0 to about 14.0. From the viewpoint of an ability to remove abrasive grains and anticorrosiveness to tungsten, pH of about 10.0 to about 13.5 is preferable, and pH of about 12.0 to about 13.0 is more preferable.

Other than the organic amine (A), the quaternary ammonium hydroxide (B), the chelating agent (C), and water (W), a surface active agent (E1), a reducing agent (E2), and combinations thereof may be added as additional components (E) when necessary to the first composition for cleaning a microelectronic device provided with a tungsten wiring.

The surface active agent (E1) is preferably added to remove metallic residues and abrasive grains. Examples of such a surface active agent include nonionic surface active agents, anionic surface active agents, cationic surface active agents, amphoteric surface active agents, or any combination thereof. When present, the content of the surface active agent may be an amount necessary to reduce surface tension of the cleaning agent, and is usually 0.0001 to 1% by weight based on the weight of the first composition, preferably 0.001 to 0.1% by weight, and particularly preferably 0.001 to 0.01% by weight.

Examples of the reducing agent (E2) include organic reducing agents, inorganic reducing agents, or any combination thereof. Examples of the organic reducing agents include polyphenol based reducing agents such as catechol, hydroquinone, gallic acid, oxalic acid and salts thereof, C6 to C9 aldehydes, or any combination thereof. Examples of the inorganic reducing agents include sulfurous acid and salts thereof, and thiosulfuric acid and salts thereof. Of these reducing agents, the organic reducing agents are preferable from the viewpoint of anticorrosiveness to tungsten, the polyphenol based reducing agents are more preferable, and gallic acid is particularly preferable. When present, the content of the reducing agent is usually 0.0001 to 1.0% by weight, more preferably 0.001 to 0.5% by weight, and particularly preferably 0.01 to 0.1% by weight, based on the weight of the first composition.

In a particularly preferred embodiment, the first composition comprises, consists of, or consists essentially of TMAH, TEP, EDTA and water.

The first composition useful for removing material from a microelectronic device provided with tungsten wiring is obtained by mixing the organic amine (A), the quaternary ammonium hydroxide (B), the chelating agent (C), and other components (E) when necessary, with water (W). A method for mixing the individual components is not particularly limited. From the viewpoint of easy and uniform mixing in a short time or the like, however, a method for mixing water (W) with the organic amine (A) and the quaternary ammonium hydroxide (B), and then mixing the chelating agent (C) and other components (E), when present, is preferable. A stirrer, a dispersion machine, or the like can be used as a mixing apparatus. Examples of the stirrer include mechanical stirrers and magnetic stirrers. Examples of the dispersion machine include homogenizers, ultrasonic dispersion machines, ball mills, and bead mills.

It should be appreciated that the first composition can be useful to removal material from a microelectronic device comprising tungsten or tungsten alloy wiring, as well as microelectronic devices having a wiring made of a different metal such as a copper wiring, aluminum substrates for recording medium magnetic disks, glassy carbon substrates, glass substrates, ceramic substrates, glass substrates for liquid crystals, glass substrates for solar cells, and the like. Preferably, the first composition is used to remove material after CMP of a surface comprising tungsten or tungsten wiring because it effectively removes metal residues and abrasive grains.

It should further be appreciated that the first composition can be provided in a concentrated form that can be diluted to the preferred concentrations at the point of use.

In a second aspect, a method of removing material from a microelectronic device comprising tungsten or tungsten alloy is described, said method comprising contacting a surface of the microelectronic device with a composition under conditions useful for removing material from the surface. Preferably, the composition is the first composition described herein.

In a third aspect, a second composition useful for the removal of material remaining on a microelectronic device subsequent to CMP is described, said second composition comprising, consisting of, or consists essentially of: a cyclic polyamine (P) represented by the following general formula (1) (P1) and/or a cyclic polyamine represented by the following general formula (2) (P2); a polyphenol based reducing agent (R) having 2 to 5 hydroxyl groups; a quaternary ammonium hydroxide (Q); ascorbic acid (AA); and water (W). The second composition is particularly useful for the removal of material remaining on a microelectronic device comprising copper or copper alloy, preferably subsequent to the CMP of copper or copper alloy layers.

Examples of the cyclic polyamine include a cyclic polyamine (P1) represented by the following general formula (4) and a cyclic polyamine (P2) represented by the following general formula (5).

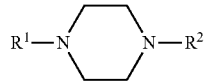

Formula 4 wherein, $R^1$ represents a hydrogen atom, an alkyl group, an amino alkyl group, or a hydroxyalkyl group; and $R^2$ represents an alkyl group, an amino alkyl group, or a hydroxyalkyl group.

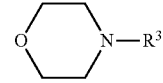

Formula 5 wherein, $R^3$ represents an amino alkyl group.

Examples of the cyclic polyamine (P1) include a cyclic polyamine (P11) having an hydrogen atom at the $R^1$ position and an alkyl group at the $R^2$ position in the above general formula (4); a cyclic polyamine (P12) having an amino alkyl group or a hydroxyalkyl group; a cyclic polyamine (P13) having an alkyl group at both of the $R^1$ position and the $R^2$ position; a cyclic polyamine (P14) having an alkyl group at the $R^1$ position and an amino alkyl group or a hydroxyalkyl group at the $R^2$ position; and a cyclic polyamine (P15) having an amino alkyl group or a hydroxyalkyl group at the $R^1$ position and an amino alkyl group or a hydroxyalkyl group at the $R^2$ position. Alternatively, a cyclic polyamine (P11) having an hydrogen atom at the $R^1$ position and an alkyl group at the $R^2$ position in the above general formula (4); a cyclic polyamine (P12) having an amino alkyl group or a hydroxyalkyl group at the $R^1$ position or the $R^2$ position; a cyclic polyamine (P13) having an alkyl group at both of the $R^1$ position and the $R^2$ position; a cyclic polyamine (P14) having an alkyl group at the $R^1$ position and an amino alkyl group or a hydroxyalkyl group at the $R^2$ position; and a cyclic polyamine (P15) having an amino alkyl group at the $R^1$ position and an amino alkyl group at the $R^2$ position.

Examples of the cyclic polyamine (P11) include N-methylpiperazine, N-ethylpiperazine, and N-isobutylpiperazine. Examples of the cyclic polyamine (P12) include N-aminomethylpiperazine, N-aminoethylpiperazine, N-aminopropylpiperazine, N-hydroxymethylpiperazine, N-hydroxyethylpiperazine, and N-hydroxypropylpiperazine. Examples of the cyclic polyamine (P13) include 1,4-dimethylpiperazine, 1,4-diethylpiperazine, 1,4-diisopropylpiperazine, and 1,4-dibutylpiperazine. Examples of the cyclic polyamine (P14) include 1-aminomethyl-4-methylpiperazine, 1-hydroxymethyl-4-methylpiperazine, 1-aminoethyl-4-ethylpiperazine, and 1-hydroxyethyl-4-ethylpiperazine. Examples of the cyclic polyamine (P15) include 1,4-(bisaminoethyl)piperazine, 1,4-(bishydroxyethyl)piperazine, 1,4-(bisaminopropyl)piperazine, 1,4-(bishydroxypropyl)piperazine, 1-aminoethyl-4-hydroxyethylpiperazine, and 1-aminopropyl-4-hydroxypropylpiperazine.

Examples of the cyclic polyamine (P12) include those having an amino alkyl group with 2 to 4 carbon atoms at the $R^3$ position in the above general formula (5). Specifically, examples thereof include N-aminoethylmorpholine, N-aminopropylmorpholine, and N-aminoisobutylmorpholine.

Of these cyclic polyamines, the cyclic polyamine (P12) having an amino alkyl group or a hydroxyalkyl group at the $R^1$ position or the $R^2$ position in the above general formula (4), the cyclic polyamine (P14), the cyclic polyamine (P15), and the cyclic polyamine (P2) having an amino alkyl group at the R³ position in the above general formula (5) are preferable from the viewpoint of anticorrosiveness to the copper wiring and an ability to remove organic residues that remain on the wafer after the CMP process.

From the viewpoint of an ability to remove the abrasive grains that remain on the wafer after the CMP process, the cyclic polyamine (P) having an amino alkyl group at the R¹ or R² position in the above general formula (4) is more preferable. N-aminoalkylpiperazine and 1,4-(bisaminoalkyl)piperazine having 1 to 3 carbon atoms in the amino alkyl group are particularly preferable.

From the viewpoint of anticorrosiveness to the copper wiring and an ability to remove organic residues, the content of the cyclic polyamine (P) in the second composition is usually 0.001 to 5% by weight, preferably 0.005 to 2% by weight, more preferably 0.01 to 1% by weight, and particularly preferably 0.01 to 0.5% by weight based on the total weight of the second composition.

The polyphenol based reducing agent (R) having 2 to 5 hydroxyl groups is a compound including a phenol skeleton having 2 to 5 hydroxyl groups bonded to a benzene ring, an aromatic ring, or the like, and may include another functional groups such as a carboxyl group. Examples of the polyphenol based reducing agent having two hydroxyl groups include catechol, caffeic acid, alizarin, endocrocin, urushiol, flavone, resorcinol, and hydroquinone. Examples of the polyphenol based reducing agent having three hydroxyl groups include emodin, pyrogallol, and gallic acid. Examples of the polyphenol based reducing agent having four or five hydroxyl groups include quercetin, catechin, and anthocyanin.

Of these reducing agents (R), the polyphenol based reducing agent having 3 to 5 hydroxyl groups is preferable from the viewpoint of anticorrosiveness to the copper wiring. From the viewpoint of chemical stability over time in the second composition, gallic acid, pyrogallol, and catechin are more preferable. Further, gallic acid having a carboxyl group in the molecule is particularly preferable from the viewpoint of an ability to remove metallic residues.

From the viewpoint of anticorrosiveness to the copper wiring and an ability to remove metallic residues, the content of the polyphenol based reducing agent (R) having 2 to 5 hydroxyl groups is usually 0.001 to 5% by weight, preferably 0.001 to 2% by weight, more preferably 0.01 to 1% by weight, and particularly preferably 0.05 to 0.5% by weight based on the total weight of the second composition.

Examples of the quaternary ammonium hydroxide (Q) include salts composed of a hydroxy anion and a cation having a hydrocarbon group bonded to a quaternary nitrogen atom. Examples of the hydrocarbon group bonded to a quaternary nitrogen atom include an alkyl group, an alkenyl group, an allyl group, an aralkyl group, and a hydrocarbon group that an alkyl group, an alkenyl group, an allyl group or an aralkyl group is partially substituted by a hydroxyl group. Preferable examples thereof include a quaternary ammonium hydroxide (Q1) represented by the following formula (6).

Formula 6

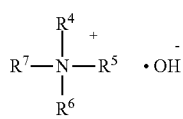

wherein R⁴ to R⁷ each independently represent an alkyl group having 1 to 4 carbon atoms or a hydroxyalkyl group having 1 to 4 carbon atoms.

Specific examples include tetraalkylammonium salts having an alkyl group with 1 to 4 carbon atoms or a hydroxyalkyl group with 1 to 4 carbon atoms, trialkyl-hydroxyalkylammonium salts having an alkyl group with 1 to 4 carbon atoms or a hydroxyalkyl group with 1 to 4 carbon atoms, dialkyl-bis(hydroxyalkyl)ammonium salts having an alkyl group with 1 to 4 carbon atoms or a hydroxyalkyl group with 1 to 4 carbon atoms, and tris(hydroxyalkyl)alkylammonium salts having an alkyl group with 1 to 4 carbon atoms or a hydroxyalkyl group with 1 to 4 carbon atoms.

Of these quaternary ammonium hydroxides (Q), tetraalkylammonium hydroxide, (hydroxyalkyl)trialkylammonium hydroxide, bis(hydroxyalkyl)dialkylammonium hydroxide, and tris(hydroxyalkyl)alkylammonium hydroxide are preferable from the viewpoint of an ability to remove organic residues. From the viewpoint of anticorrosiveness to the copper wiring, tetraalkylammonium hydroxide and (hydroxyalkyl)trialkylammonium hydroxide are preferable. Tetramethylammonium hydroxide, tetraethylammonium hydroxide, and (hydroxyethyl)trimethylammonium hydroxide(choline) are more preferable, and tetramethylammonium hydroxide is particularly preferable.

From the viewpoint of an ability to remove organic residues and anticorrosiveness to the copper wiring, the content of the quaternary ammonium hydroxide (Q) is usually 0.01 to 10% by weight, preferably 0.02 to 5% by weight, and more preferably 0.05 to 2% by weight based on the total weight of the second composition.

The second composition contains ascorbic acid (AA), specifically, L-(+)-ascorbic acid and D-(+)-ascorbic acid (called erythorbic acid by a common name). The ascorbic acid (AA) has a function to suppress oxidization of the polyphenol based reducing agent (R) having 2 to 5 hydroxyl groups, and a function to improve an ability to remove metallic residues.

From the viewpoint of anticorrosiveness to the copper wiring and an ability to remove metallic residues, the content of the ascorbic acid (AA) is usually 0.01 to 5% weight, preferably 0.05 to 3% by weight, more preferably 0.1 to 2% by weight, and particularly preferably 0.1 to 1% by weight based on the total weight of the second composition.

The second composition further contains water. Preferably, the water has low conductivity (μS/cm; 25° C.). Specifically, the conductivity thereof is usually about 0.055 to about 0.2, preferably about 0.056 to about 0.1, and more preferably about 0.057 to about 0.08 from the viewpoint of an ability to remove organic residues and metallic residues, availability, and prevention of the copper wiring from recontamination (reattachment of metal ions in the water to the copper wiring). Ultrapure water is preferable.

From the viewpoint of an ability to remove organic residues, an ability to remove metallic residues, and viscosity of the solution, the content of water is usually 69.0 to 99.9% by weight, preferably 79.0 to 99.5% by weight, more preferably 89.0 to 99.0% by weight, and particularly preferably 92.0 to 99.0% by weight based on the total weight of the second composition.

Other than the cyclic polyamine (P), the polyphenol based reducing agent (R) having 2 to 5 hydroxyl groups, the quaternary ammonium hydroxide (Q), the ascorbic acid (AA), and water (W) as the essential components, a surface active agent (E1), a reducing agent (R2) other than the polyphenol based reducing agent (R) having 2 to 5 hydroxyl groups, a complexing agent (E3), a corrosion inhibitor (E4), and combinations thereof, may be added as additional components when necessary to the second composition for the removal of material from a microelectronic device comprising copper.

Examples of useful surface active agents (E1) were described herein in the first aspect.

Examples of the reducing agent (R2) other than the polyphenol based reducing agent (R) having 2 to 5 hydroxyl groups include organic reducing agents and inorganic reducing agents. Examples of the organic reducing agent include phenol compounds and benzaldehydes having one hydroxyl group and 6 to 30 carbon atoms such as oxalic acid and salts thereof, hydrogen oxalate and salts thereof, and aldehydes having 6 to 9 carbon atoms. Examples of the inorganic reducing agent include sulfurous acid and salts thereof, and thiosulfuric acid and salts thereof.

From the viewpoint of water solubility and anticorrosiveness to the copper wiring, of these reducing agents (R2), the organic reducing agents are preferable, aliphatic organic reducing agents are more preferable, and oxalic acid and salts thereof are particularly preferable. Moreover, from the viewpoint of complexing action, oxalate salts are preferable and ammonium oxalate is more preferable.

The content of the reducing agent (R2) is usually 0.001 to 1.0% by weight, more preferably 0.01 to 0.5% by weight, and particularly preferably 0.05 to 0.1% by weight based on the weight of the second composition from the viewpoint of improving anticorrosiveness to the copper wiring. In the case where the content of these reducing agents, i.e., the reducing agent other than the polyphenol based reducing agent having 2 to 5 hydroxyl groups exceeds 1.0% by weight, anticorrosiveness to the copper wiring is decreased instead.

Examples of the complexing agent (E3) include aromatic and aliphatic hydroxycarboxylic acids having 1 to 6 carbon atoms (and salts thereof), heterocyclic compounds having at least one of a hydroxyl group having 9 to 23 carbon atoms and a carboxyl group having 9 to 23 carbon atoms, and phosphonic acids having 6 to 9 carbon atoms (and salts thereof). Of these complexing agents (E3), from the viewpoint of improving anticorrosiveness to the copper wiring, an aliphatic hydroxycarboxylic acid (or a salt thereof) and a polycarboxylic acid (or a salt thereof) are preferable, and an aliphatic hydroxycarboxylic acid (or a salt thereof) are particularly preferable.

In the case of adding the complexing agent, the content of the complexing agent (E3) is usually 0.001 to 0.5% by weight, preferably 0.01 to 0.3% by weight, and particularly preferably 0.05 to 0.1% by weight based on the weight of the second composition from the viewpoint of improving anticorrosiveness to the copper wiring.

Suitable corrosion inhibitors (E4) include, but are not limited to, ribosylpurines such as N-ribosylpurine, adenosine, guanosine, 2-aminopurine riboside, 2-methoxyadenosine, and methylated or deoxy derivatives thereof, such as N-methyladenosine ($C_{11}H_{15}N_5O_4$), N,N-dimethyladenosine ($C_{12}H_{17}N_5O_4$), trimethylated adenosine ($C_{13}H_{19}N_5O_4$), trimethyl N-methyladenosine ($C_{14}H_{21}N_5O_4$), C-4'-methyladenosine, and 3-deoxyadenosine; degradation products of adenosine and adenosine derivatives including, but not limited to, adenine ($C_5H_5N_5$), methylated adenine (e.g., N-methyl-7H-purin-6-amine, $C_6H_7N_5$), dimethylated adenine (e.g., N,N-dimethyl-7H-purin-6-amine, $C_7H_9N_5$), N4,N4-dimethylpyrimidine-4,5,6-triamine ($C_6H_{11}N_5$), 4,5,6-triaminopyrimidine, allantoin ($C_4H_6N_4O_3$), hydroxylated C—O—O—C dimers (($C_5H_4N_5O_2)_2$), C—C bridged dimers (($C_5H_4N_5)_2$ or ($C_5H_4N_5O)_2$), methylated ribose ($C_5H_{10}O_5$), ribose (e.g., 5-(methoxymethyl)tetrahydrofuran-2,3,4-triol, $C_6H_{12}O_5$), tetramethylated ribose (e.g., 2,3,4-trimethoxy-5-(methoxymethyl)tetrahydrofuran, $C_9H_{18}O_5$), and other ribose derivatives such as methylated hydrolyzed diribose compounds; purine-saccharide complexes including, but not limited to, xylose, glucose, etc.; other purine compounds such as purine, guanine, hypoxanthine, xanthine, theobromine, caffeine, uric acid, and isoguanine, and methylated or deoxy derivatives thereof; triaminopyrimidine and other substituted pyrimidines such as amino-substituted pyrimidines; dimers, trimers or polymers of any of the compounds, reaction or degradation products, or derivatives thereof; and combinations thereof. For example, the corrosion inhibitors may comprise at least one species selected from the group consisting of N-ribosylpurine, 2-aminopurine riboside, 2-methoxyadenosine, N-methyladenosine, N,N-dimethyladenosine, trimethylated adenosine, trimethyl N-methyladenosine, C-4'-methyladenosine, 3-deoxyadenosine; methylated adenine, dimethylated adenine, N4,N4-dimethylpyrimidine-4,5,6-triamine, 4,5,6-triaminopyrimidine, hydroxylated C—O—O—C dimers, C—C bridged dimers, ribose, methylated ribose, tetramethylated ribose, xylose, glucose, isoguanine, triaminopyrimidine, amino-substituted pyrimidines, and combinations thereof. Alternatively, the corrosion inhibitors may include at least one species selected from the group consisting of 2-methoxyadenosine, N-methyladenosine, N,N-dimethyladenosine, trimethylated adenosine, trimethyl N-methyladenosine, C-4'-methyladenosine, 3-deoxyadenosine and combinations thereof.

In a particularly preferred embodiment, the second composition comprises, consists of, or consists essentially of TMAH, N-aminoethylpiperazine (AEP), ascorbic acid, gallic acid, adenosine, and water.

In a particularly preferred embodiment, the second composition is substantially devoid of abrasive (prior to cleaning), aminotetrazole, and fluoride. "Substantially devoid" is defined herein as less than 2 wt. %, preferably less than 1 wt. %, more preferably less than 0.5 wt. %, most preferably less than 0.1 wt. %, and most preferably 0 wt % , based on the total weight of the composition.

The second composition can be produced by mixing the cyclic polyamine (P), the polyphenol based reducing agent (R) having 2 to 5 hydroxyl groups, the quaternary ammonium hydroxide (Q), the ascorbic acid (AA), and other components when present, with water. A method for mixing these is not particularly limited. From the viewpoint of easy and uniform mixing in a short time or the like, however, a method for mixing water and the polyphenol based reducing agent (R) having 2 to 5 hydroxyl groups with the ascorbic acid (AA), and then mixing the cyclic polyamine (P), the quaternary ammonium hydroxide (Q) and other components when necessary is preferable. The temperature and time during performing uniform mixing are not limited, and can be determined properly according to the scale, equipment, and the like for production.

A stirrer or a dispersion machine can be used as a mixing apparatus. Examples of the stirrer include mechanical stirrers and magnetic stirrers. Examples of the dispersion machine include homogenizers, ultrasonic dispersion machines, ball mills, and bead mills.

It should be appreciated that the second composition can be useful to removal material from a microelectronic device comprising copper or copper alloy wiring, as well as microelectronic devices having a wiring made of a different metal such as a copper wiring, copper plated substrates for semiconductor cleaning evaluation, aluminum substrates for recording medium magnetic disks, glassy carbon substrates, glass substrates, ceramic substrates, glass substrates for liquid crystals, glass substrates for solar cells, and the like. Preferably, the second composition is used to remove material after CMP of a surface comprising copper or copper wiring because it effectively removes metal residues and abrasive grains.

It should further be appreciated that the second composition can be provided in a concentrated form that can be diluted to the preferred concentrations at the point of use.

In a fourth aspect, a method of removing material from a microelectronic device comprising copper or copper alloy is described, said method comprising contacting a surface of the microelectronic device with a composition under conditions useful for removing material from the surface. Preferably, the composition is the second composition described herein.

Examples of the cleaning method for removing material from a microelectronic device having a metal wiring include a single wafer method and a batch method. The single wafer method is a method for cleaning one microelectronic device at a time using a brush by rotating the microelectronic device while injecting the appropriate composition. The batch method is a method for cleaning several microelectronic devices by soaking the microelectronic devices in the appropriate composition.

In yet another aspect, the first and second compositions can be used during a cleaning step after resist development, after dry etching, after wet etching, after dry ashing, after resist removing, before and after the CMP treatment, and before and after the CVD treatment in the process in which a microelectronic device having a metal wiring is produced.

EXAMPLES

Hereinafter, compositions and methods will be further described using Examples and Comparative Examples, but the present invention will not be limited to these. Hereinafter, % means % by weight and parts means parts by weight unless otherwise specified.

Hereinafter, preparation of a cleaning agent for a semiconductor provided with a tungsten wiring according to Examples 1 to 5 and Comparative Examples 1 to 4 will be described.

Example 1

0.14 parts of TEP (A-1) (trade name: AFR-AN6, purity of 99.2%, made by Tosoh Corporation), 0.240 parts of a 25% TMAH aqueous solution (B-1) (trade name: 25% TMAH solution, an aqueous solution with purity of 25%, made by Tama Chemicals Co., Ltd.), 0.002 parts of ethylenediamine tetraacetate (C-1) (trade name: Chelest 3A, purity of 98.0%, made by Chelest Corporation) were added to a 300-ml container made of polyethylene. Then, 99.8 parts of water (W) was added so that the total weight was 100 parts. The solution was stirred by a magnetic stirrer to obtain a first composition for removing material from a microelectronic device comprising tungsten wiring (D-1). The pH of the obtained cleaning agent was 13.2.

Example 2

The same operation as that in Example 1 was performed except that 0.14 parts of MEA (A-2) (purity of 99%, made by Wako Pure Chemical Industries, Ltd.) was used instead of (A-1) in Example 1, the blending amount of (B-1) was changed to 0.200 parts, the blending amount of (C-1) was changed to 0.004 parts, and water was added so that the total weight was 100 parts. Thereby, a first composition for removing material from a microelectronic device comprising tungsten wiring (D-2) was obtained. The pH of the obtained cleaning agent was 12.5.

Example 3

The same operation as that in Example 1 was performed except that a 25% TEAH aqueous solution (B-2) (trade name: 25% TEAH solution, an aqueous solution with purity of 25%, made by Wako Pure Chemical Industries, Ltd.) was used instead of (B-1) in Example 1. Thereby, a first composition for removing material from a microelectronic device comprising tungsten wiring (D-3) was obtained. The pH of the obtained cleaning agent was 12.4.

Example 4

The same operation as that in Example 1 was performed except that hydroxyethylethylenediamine triacetate (C-2) (purity of 98.0%, made by Wako Pure Chemical Industries, Ltd.) was used instead of (C-1) in Example 1, and the blending amount thereof was 0.004 parts. Thereby, a first composition for removing material from a microelectronic device comprising tungsten wiring (D-4) was obtained. The pH of the obtained cleaning agent was 12.9.

Example 5

The same operation as that in Example 1 was performed except that the blending amount of (A-1) in Example 4 was changed to 0.07 parts, the blending amount of (B-1) in Example 4 was changed to 0.08 parts, the blending amount of (C-1) in Example 4 was changed to 0.006 parts, and water was added so that the total weight was 100 parts. Thereby, a first composition for removing material from a microelectronic device comprising tungsten wiring (D-5) was obtained. The pH of the obtained cleaning agent was 9.2.

Comparative Example 1

The same operation as that in Example 1 was performed except that (A-1) in Example 1 was not added. Thereby, a comparative composition for removing material from a microelectronic device comprising tungsten wiring (D'-1) was obtained. The pH of the obtained cleaning agent was 10.4.

Comparative Example 2

The same operation as that in Example 1 was performed except that (B-1) in Example 1 was not added. Thereby, a comparative composition for removing material from a microelectronic device comprising tungsten wiring (D'-2) was obtained. The pH of the obtained cleaning agent was 9.1.

Comparative Example 3

The same operation as that in Example 1 was performed except that (C-1) in Example 1 was not added. Thereby, a comparative composition for removing material from a microelectronic device comprising tungsten wiring (D'-3) was obtained. The pH of the obtained cleaning agent was 13.4.

Comparative Example 4

The same operation as that in Example 1 was performed except that 0.100 parts of ethylenediamine tetraacetate (C-1)

and 5.00 parts of oxalic acid (purity of 99%, made by Wako Pure Chemical Industries, Ltd.) were added, and then water was added so that the total weight was 100 parts. Thereby, a comparative composition for removing material from a microelectronic device comprising tungsten wiring (D'-4) was obtained. The pH of the obtained cleaning agent was 4.5.

The first compositions (D-1) to (D-5) and the comparative compositions (D'-1) to (D'-4) were tested for anticorrosiveness to tungsten, an ability to remove metallic residues, and an ability to remove abrasive grains and evaluated. Table 1 summarizes the results.

Equation 1

$$\text{Amount of tungsten eluted } (ng/cm^2) = \frac{W_{con} \times F1 \times F3}{F2 \times S_W} \quad (1)$$

wherein, $W_{con}$=tungsten concentration in the measuring liquid determined by the ICP-MS analysis (ppb (ng/g)); F1=amount of the first composition in which the test piece is immersed (g); F2=amount of the first composition collected

TABLE 1

| | Composition of cleaning agent | | | | | | | | Performance of cleaning agent | | |
|---|---|---|---|---|---|---|---|---|---|---|---|
| | Organic amine (A) | | Quaternary ammonium hydroxide (B) | | Chelating agent (C) | | Other component | | Water (W) | | Anticorrosiveness to tungsten | Ability to remove metallic residues | Ability to remove abrasive grains |
| | component | Content (%) | component | Content (%) | component | Content (%) | component | Content (%) | Content (%) | pH | | | |
| (D-1) | TEP | 0.14 | TMAH | 0.06 | EDTA | 0.002 | — | | 99.80 | 13.2 | ○ | ○ | ○ |
| (D-2) | MEA | 0.14 | TMAH | 0.05 | EDTA | 0.004 | — | | 99.81 | 12.5 | ○ | ○ | ○ |
| (D-3) | TEP | 0.14 | TMAH | 0.06 | EDTA | 0.002 | — | | 99.80 | 12.4 | ○ | ○ | ○ |
| (D-4) | TEP | 0.14 | TMAH | 0.06 | HEDTA | 0.004 | — | | 99.80 | 12.9 | ○ | ○ | ○ |
| (D-5) | TEP | 0.07 | TMAH | 0.02 | HEDTA | 0.006 | | | 99.90 | 9.2 | ○ | ○ | ○ |
| (D'-1) | | | TMAH | 0.06 | EDTA | 0.002 | | | 99.94 | 10.4 | ○ | x | □ |
| (D'-2) | TEP | 0.14 | | | EDTA | 0.002 | | | 99.86 | 9.1 | ○ | ○ | x |
| (D'-3) | TEP | 0.14 | TMAH | 0.06 | | | | | 99.80 | 13.4 | ○ | x | ○ |
| (D'-4) | | | | | EDTA | 0.100 | Oxalic acid | 5.00 | 94.90 | 4.5 | □ | ○ | x |

Evaluation of Anticorrosiveness to Tungsten

Evaluation of anticorrosiveness to tungsten was performed by immersing a wafer having a tungsten single layer film in the cleaning agents of Examples 1 to 5 and Comparative Examples 1 to 4, and determining a concentration of tungsten eluted from the wafer in the composition. It was determined that anticorrosiveness of the first composition to tungsten was better as the amount of tungsten eluted per unit area was smaller.

The procedure of the evaluation method was:
(1) Pretreatment of Wafer Having Tungsten Single Layer Film A wafer having a tungsten single layer film (made by Advanced Materials Technology Inc., obtained by vapor-depositing a tungsten metal at a thickness of 2 μm on a silicon substrate) was cut into a piece 1.0 cm long by 2.0 cm wide, immersed in a 10% acetic acid aqueous solution for 1 minute, and washed with water.
(2) Elution of Tungsten In 10 g of each of the first and comparative compositions, the pretreated piece of the wafer having a tungsten single layer film was immersed for 3 minutes at 25° C. before removal from the composition.
(3) Measurement of Amount of Tungsten Eluted 5 g of the first composition subsequent to elution was collected, and the pH thereof was adjusted to 3.0 with a nitric acid aqueous solution. Then, water was added until the total amount reached 10 g, and a measuring liquid was prepared. The concentration of tungsten in the measuring liquid was measured using an ICP-MS analysis apparatus (inductively coupled plasma source mass spectrometer) (made by Agilent Technologies, Inc., Agilent 7500cs type).
(4) Evaluation and Determination of Anticorrosiveness to Tungsten The concentration of tungsten was substituted into the following equation (1), and the amount of tungsten eluted (ng/cm$^2$) was calculated:

before adjusting the pH (g); F3=amount of the measuring liquid (g); and $S_w$=area of a tungsten single layer film in the wafer having a tungsten single layer film (cm$^2$).

Anticorrosiveness to tungsten was determined from the calculated amount of tungsten eluted according to the following criteria:
○: Less than 15 ng/cm$^2$
□: 15 ng/cm$^2$ to 20 ng/cm$^2$
x: Not less than 20 ng/cm$^2$ Method for Evaluating Ability to Remove Metallic Residues Evaluation of an ability to remove metallic residues was performed as follows: a wafer having a silicon oxide single layer film was immersed in an aqueous solution containing zinc, iron, and magnesium metal ions to contaminate the wafer; the wafer was then immersed in the cleaning agents of Examples 1 to 5 and Comparative Examples 1 to 4; and the concentrations of zinc, iron, and magnesium metal ions eluted from the surface of the wafer in the cleaning agents of Examples 1 to 5 and Comparative Examples 1 to 4 were determined with an ICP-MS analysis apparatus.

It was determined that an ability to remove metallic residues was higher as the amount of metal ions eluted per wafer unit area was larger.

The procedure of the evaluation method was:
(1) Pretreatment of Wafer Having a Silicon Oxide Single Layer Film A silicon wafer having a silicon oxide single layer film (made by ADVANTEC Co., Ltd., "P-TEOS 1.5μ," thickness of silicon oxide=1.5 μm.) was cut into a piece 1.0 cm long by 2.0 cm wide, immersed in a 10% acetic acid aqueous solution for 1 minute, and washed with water.
(2) Preparation of Aqueous Solution Containing Metal Ions Water was added to 0.1 parts of zinc nitrate, 0.1 parts of iron nitrate, and 0.1 parts of magnesium nitrate so that the total amount was 100 g, to prepare an aqueous solution containing 0.1% metal ions of zinc, 0.1% metal ions of iron, and 0.1% metal ions of magnesium.

(3) Contamination Treatment of Wafer with Metal Ion Aqueous Solution

The pretreated piece of the wafer having a silicon oxide single layer film was immersed in 10 g of the aqueous solution containing the metal ions for 1 minute, and then dried by nitrogen blow. Thereby, the metal ions were attached to the surface of the wafer.

(4) Washing of Wafer

In 10 g of each of the first and comparative compositions, the piece of the wafer having a silicon oxide single layer film that was subjected to the contamination treatment was immersed for 3 minutes at 25° C., followed by removing the wafer from the composition.

(5) Measurement of Concentration of Metal Ions Eluted in Cleaning Agent from Surface of Wafer 5 g of the second composition after the wafer was immersed was collected, and the pH thereof was adjusted to 3.0 with a nitric acid aqueous solution. Then, water was added until the total amount reached 10 g, and a measuring liquid was prepared. The concentrations of metal ions of zinc, of iron, and of magnesium contained in the measuring liquid were measured using an ICP-MS analysis apparatus.

(6) Evaluation and Determination of Ability to Remove Metallic Residues

An amount of each metal ion eluted was calculated using the following equation:

Equation 2

$$\text{Amount of metal ions eluted } (ng/cm^2) = \frac{Metal_{con} \times G1 \times G3}{G2 \times S_{SiO2}} \quad (2)$$

wherein, $Metal_{con}$=ion concentration of each metal in the measuring liquid determined by ICP-MS analysis (ppb(ng/g)); G1=amount of the first/second composition in which a test piece is immersed (g); G2=amount of the first/second composition collected before adjusting the pH (g); G3=amount of the measuring liquid (g); and $S_{SiO2}$=area of the silicon oxide film in the wafer having a single layer film of silicon oxide (cm²)

From the total amount of the calculated amounts of the ions of respective metals eluted, an ability to remove metallic residues was determined according to the following criteria:

○: Not less than 15 ng/cm²

□: 10 ng/cm² to 15 ng/cm² x: Less than 10 ng/cm²

Method for Measuring Ability to Remove Abrasive Grains

Evaluation of an ability to remove abrasive grains was performed. A wafer having a silicon nitride single layer film was immersed in a CMP slurry used at a CMP step for a tungsten wiring to be contaminated. Then, the wafer was immersed in the cleaning agent of Examples 1 to 5 and Comparative Examples 1 to 4 for a semiconductor provided with a tungsten alloy wiring. After the wafer after washing was dried, a degree of remaining abrasive grains per visual field was observed using an SEM (scanning electron microscope). It was determined that an ability to remove abrasive grains was higher as the number of the remaining abrasive grains per visual field was smaller.

The procedure of the evaluation method was:

(1) Washing of Wafer Having Silicon Nitride Single Layer Film

A wafer having a silicon nitride single layer film (made by Advanced Materials Technology Inc., "PE-CVDSiN 1.5μ," thickness of silicon nitride=1.0 μm.) was immersed in a 10% acetic acid aqueous solution for 1 minute, and then washed with water.

(2) Contamination Treatment with CMP Slurry

The wafer having a silicon nitride single layer film was immersed in a CMP slurry (made by Cabot Corporation, W7000, principal component of abrasive grains of $SiO_2$, average particle size of 0.2 μm) for 1 minute, and then dried by nitrogen blow. The obtained wafer after the contamination treatment was cut into 1.0 cm long by 1.5 cm wide.

(3) Washing with Cleaning Agent for Semiconductor Provided with Tungsten Wiring

In 10 g of each of the first and comparative compositions, a wafer having a contaminated silicon nitride single layer film was immersed, and left to stand for 3 minutes at 25° C. Then, the wafer having a silicon nitride single layer film was removed from the first composition, and dried by nitrogen blow.

(4) SEM Observation of Surface of Wafer Having Silicon Nitride Single Layer Film after Washing The surface of the wafer having a silicon nitride single layer film after washing was observed at a magnification of 10,000 using an SEM (made by Hitachi High-Technologies Corporation, model name S-4800).

(5) Evaluation of Ability to Remove Abrasive Grains

From an SEM image of the surface of the wafer, the number of remaining abrasive grains per visual field was checked, and an ability to remove abrasive grains was determined by the following criteria:

○: Less than 10

□: 10 to 20 x: Not less than 20

As shown in Table 1, the first composition according to Examples 1 to 5 had favorable results in all three evaluated items. On the other hand, in Comparative Example 1 containing no organic amine (A), an ability to remove metallic residues was poor, and an ability to remove abrasive grains was also insufficient. In Comparative Example 2 containing no quaternary ammonium hydroxide (B), an ability to remove abrasive grains was poor. In Comparative Example 3 containing no chelating agent (C), an ability to remove metallic residues was poor. Furthermore, in Comparative Example 4 containing only the chelating agent (C) and the oxalic acid, anticorrosiveness to tungsten was insufficient, and an ability to remove abrasive grains was poor.

Hereinafter, preparation of cleaning agents for a semiconductor provided with a copper wiring according to Examples 6 to 11 and Comparative Examples 5 to 12 will be described.

Example 6

0.07 parts of N-aminoethylpiperazine (AEP) (purity of 99%, made by Wako Pure Chemical Industries, Ltd.) and 0.05 parts of gallic acid (trade name: gallic acid monohydrate, purity of 99%, made by Wako Pure Chemical Industries, Ltd.) were added to a 300-ml container made of polyethylene. Next, 0.28 parts of a 25% TMAH aqueous solution (C-1) (trade name: 25% TMAH, an aqueous solution with purity of 25%, made by Tama Chemicals Co., Ltd.), and 0.18 parts of L-ascorbic acid (trade name: L(+)-ascorbic acid (L-AA), purity of 99.5%, made by Nacalai Tesque, Inc.) were added. Then, 99.4 parts of water was added so that the total weight might be 100 parts. The solution was stirred by a magnetic stirrer to obtain a second composition for removing material from a microelectronic device comprising copper wiring (F-6) was obtained.

Example 7

The same operation as that in Example 6 was performed except that 0.10 parts of N-isobutylpiperazine (purity of 98%, made by Wako Pure Chemical Industries, Ltd.) was used instead of AEP in Example 6, a blending amount of TMAH was changed to 0.40 parts, and water was added so that the total weight might be 100 parts. Thereby, a second composition for removing material from a microelectronic device comprising copper wiring (F-7) was obtained.

Example 8

The same operation as that in Example 6 was performed except that 0.13 parts of N-hydroxypropyl piperazine (purity of 98% made by Wako Pure Chemical Industries, Ltd.) was used instead of AEP in Example 6, a blending amount of TMAH was changed to 0.52 parts, and water was added so that the total weight might be 100 parts. Thereby, a second composition for removing material from a microelectronic device comprising copper wiring (F-8) was obtained.

Example 9

The same operation as that in Example 6 was performed except that 0.08 parts of 1,4-dimethylpiperazine (purity of 98%, made by Koei Chemical Co., Ltd.) was used instead of AEP in Example 6, 0.32 parts of a 25% TEAH aqueous solution (C-2) (an aqueous solution with purity of 25%, made by Wako Pure Chemical Industries, Ltd.) was used instead of TMAH, 0.18 parts of D-ascorbic acid (D-AA) (trade name: D(+)-ascorbic acid, purity of 99.5%, made by Nacalai Tesque, Inc.) was used instead of L(+)-ascorbic acid, and water was added so that the total weight might be 100 parts. Thereby, a second composition for removing material from a microelectronic device comprising copper wiring (F-9) was obtained.

Example 10

The same operation as that in Example 9 was performed except that 0.08 parts of 1,4-(bisaminopropyl)piperazine (purity of 98%, made by Koei Chemical Co., Ltd.) was used instead of 1,4-dimethylpiperazine in Example 9, 0.52 parts of a 25% TMAH aqueous solution was used instead of TEAH, and water was added so that the total weight might be 100 parts. Thereby, a second composition for removing material from a microelectronic device comprising copper wiring (F-10) was obtained.

Example 11

The same operation as that in Example 10 was performed except that 0.08 parts of N-aminoethylmorpholine (purity of 98%, made by Koei Chemical Co., Ltd.) was used instead of 1,4-(bisaminopropyl)piperazine in Example 10, the blending amount of TMAH was changed to 0.32 parts, and water was added so that the total weight might be 100 parts. Thereby, a second composition for removing material from a microelectronic device comprising copper wiring (F-11) was obtained.

The content of each component is shown in Table 2 in % by weight about the cleaning agents for a semiconductor provided with a copper wiring (F-6) to (F-11) according to Examples 6 to 11.

The content of the quaternary ammonium hydroxide (Q) is shown in % by weight by converting the blended quaternary ammonium hydroxide aqueous solution into a solid content. In the used cyclic polyamine (P), bonding groups at the $R^1$ to $R^3$ positions in the above general formula (1) and general formula (2) are shown in Table 3.

TABLE 2

| Cleaning agent | Cyclic polyamine | | Polyphenol based reducing agent having 2 to 5 hydroxyl groups | | Quaternary ammonium hydroxide | | Ascorbic acid | | Water |
|---|---|---|---|---|---|---|---|---|---|
| | Name of component | Content (%) | Name of component | Content (%) | Name of component | Content (%) | Name of component | Content (%) | Content (%) |
| (F-6) | N-Aminoethylpiperazine | 0.07 | Gallic acid | 0.05 | TMAH | 0.07 | L-AA | 0.18 | 99.6 |
| (F-7) | N-isobutylpiperazine | 0.10 | Gallic acid | 0.05 | TMAH | 0.10 | L-AA | 0.18 | 99.6 |
| (F-8) | N-hydroxypropylpiperazine | 0.13 | Gallic acid | 0.05 | TMAH | 0.13 | L-AA | 0.18 | 99.5 |
| (F-9) | 1,4-dimethylpiperazine | 0.08 | Gallic acid | 0.05 | TEAH | 0.08 | D-AA | 0.18 | 99.6 |
| (F-10) | 1,4-(bisaminopropyl)piperazine | 0.08 | Gallic acid | 0.05 | TMAH | 0.13 | D-AA | 0.18 | 99.6 |
| (F-11) | N-aminoethylmorpholine | 0.08 | Gallic acid | 0.05 | TMAH | 0.08 | D-AA | 0.18 | 99.6 |

TABLE 3

| | Cyclic polyamine | | |
|---|---|---|---|
| Name of component | component at $R^1$ | component at $R^2$ | component at $R^3$ |
| N-Aminoethylpiperazine | H | $CH_2CH_2NH_2$ | |
| N-isobutylpiperazine | H | $CH_2CH(CH_3)_2$ | |
| N-hydroxypropylpiperazine | H | $CH_2(CH_2)_2OH$ | |
| 1,4-dimethylpiperazine | $CH_3$ | $CH_3$ | |

TABLE 3-continued

| | Cyclic polyamine | | |
| Name of component | component at $R^1$ | component at $R^2$ | component at $R^3$ |
|---|---|---|---|
| 1,4-(bisaminopropyl)piperazine | $CH_2(CH_2)_2NH_2$ | $CH_2(CH_2)_2NH_2$ | |
| N-aminoethylmorpholine | | | $CH_2CH_2NH_2$ |

Comparative Example 5

The same operation as that in Example 6 was performed except that the gallic acid in Example 6 was not added. Thereby, a comparison composition for a semiconductor provided with a copper wiring (F'-5) was obtained.

Comparative Example 6

The same operation as that in Example 7 was performed except that the L-ascorbic acid in Example 7 was not added. Thereby, a comparison composition for a semiconductor provided with a copper wiring (F'-6) was obtained.

Comparative Example 7

The same operation as that in Example 8 was performed except that 0.13 parts of piperazine (purity of 98%, made by Koei Chemical Co., Ltd.) was added instead of AEP in Example 8. Thereby, a comparison composition for a semiconductor provided with a copper wiring (F'-7) was obtained.

Comparative Example 8

The same operation as that in Example 11 was performed except that 0.08 parts of N-methylmorpholine (purity of 98%, made by Koei Chemical Co., Ltd.) was used instead of N-aminoethylmorpholine in Example 11. Thereby, a comparison composition for a semiconductor provided with a copper wiring (F'-8) was obtained.

Comparative Example 9

The same operation as that in Example 8 was performed except that 0.08 parts of 4-picoline (purity of 97%, made by Koei Chemical Co., Ltd.) was used instead of N-hydroxypropyl piperazine in Example 8. Thereby, a comparison composition for a semiconductor provided with a copper wiring (F'-9) was obtained.

Comparative Example 10

The same operation as that in Example 8 was performed except that 0.08 parts of triethanolamine (purity of 98%, made by Wako Pure Chemical Industries, Ltd.) was used instead of N-hydroxypropyl piperazine in Example 8. Thereby, a comparison composition for a semiconductor provided with a copper wiring (F'-10) was obtained.

Comparative Example 11

The same operation as that in Example 6 was performed except that 0.08 parts of tetraethylenepentamine (trade name: AFR-AN6, purity of 99.2%, made by Tosoh Corporation) was used instead of AEP in Example 6. Thereby, a comparison composition for a semiconductor provided with a copper wiring (F'-11) was obtained.

Comparative Example 12

The same operation as that in Example 6 was performed except that 0.20 parts of citric acid (purity of 99%, made by Nacalai Tesque, Inc.) was added while the gallic acid and L-ascorbic acid were removed. Thereby, a comparison composition for a semiconductor provided with a copper wiring (F'-12) was obtained.

The content of each component is shown in Table 4 in % by weight for comparative compositions (F'-5) to (F'-12) in Comparative Examples 5 to 12. The content of the quaternary ammonium hydroxide is shown in % by weight by converting the blended quaternary ammonium hydroxide aqueous solution into a solid content. In the used cyclic polyamine (P), bonding groups at the $R^1$ to $R^3$ positions in the above general formula (1) and general formula (2) are shown in Table 5.

TABLE 4

| Cleaning agent | Cyclic polyamine | | Polyphenol based reducing agent having 2 to 5 hydroxyl groups | | Quaternary ammonium hydroxide | | Ascorbic acid | | Other component | | water |
|---|---|---|---|---|---|---|---|---|---|---|---|
| | Name of component | Content (%) | Name of component | Content (%) | Name of component | Content (%) | Name of component | Content (%) | Name of component | Content (%) | Content (%) |
| (F'-5) | N-aminoethylpiperazine | 0.07 | — | — | TMAH | 0.07 | L-AA | 0.18 | — | 0.00 | 99.7 |
| (F'-6) | N-isobutylpiperazine | 0.10 | Gallic acid | 0.05 | TMAH | 0.10 | — | — | — | 0.00 | 99.7 |
| (F'-7) | Piperazine | 0.13 | Gallic acid | 0.05 | TMAH | 0.13 | L-AA | 0.18 | — | 0.00 | 99.5 |
| (F'-8) | N-methylmorpholine | 0.08 | Gallic acid | 0.05 | TEAH | 0.08 | D-AA | 0.18 | — | 0.00 | 99.6 |
| (F'-9) | 4-picoline | 0.08 | Gallic acid | 0.05 | TMAH | 0.13 | L-AA | 0.18 | — | 0.00 | 99.6 |
| (F'-10) | Triethanolamine | 0.08 | Gallic acid | 0.05 | TMAH | 0.13 | L-AA | 0.18 | — | 0.00 | 99.6 |
| (F'-11) | Tetraethylenepentamine | 0.07 | Gallic acid | 0.05 | TMAH | 0.07 | L-AA | 0.18 | — | 0.00 | 99.6 |
| (F'-12) | N-aminoethylpiperazine | 0.07 | — | — | TMAH | 0.07 | — | — | Citric acid | 0.20 | 99.7 |

TABLE 5

| Name of component | Cyclic polyamine | | |
|---|---|---|---|
| | Composition at $R^1$ | Composition at $R^2$ | Composition at $R^3$ |
| N-aminoethylpiperazine | H | $CH_2CH_2NH_2$ | |
| N-isobutylpiperazine | H | $CH_2CH(CH_3)_2$ | |
| Piperazine | H | H | |
| N-methylmorpholine | | | $CH_3$ |
| 4-picoline | | | |
| Triethanolamine | | | |
| Tetraethylenepentamine | | | |
| N-aminoethylpiperazine | H | $CH_2CH_2NH_2$ | |

In the second compositions (F-6) to (F-11) prepared in Examples 6 to 11 and the comparative compositions (F'-5) to (F'-12) prepared in Comparative Examples 5 to 12, an ability to remove organic residues, an ability to remove abrasive grains, an ability to remove metallic residues, and anticorrosiveness to the copper wiring were measured and evaluated using the following methods. Table 6 shows the evaluation result.

TABLE 6

| | Cleaning agent | Ability to remove organic residues | Ability to remove abrasive grains | Ability to remove metallic residues | Anticorrosiveness to copper wiring |
|---|---|---|---|---|---|
| Example 6 | (F-6) | ○ | ○ | ○ | ○ |
| Example 7 | (F-7) | ○ | ○ | ○ | ○ |
| Example 8 | (F-8) | ○ | ○ | ○ | ○ |
| Example 9 | (F-9) | ○ | ○ | ○ | ○ |
| Example 10 | (F-10) | ○ | ○ | ○ | ○ |
| Example 11 | (F-11) | ○ | ○ | ○ | ○ |
| Comparative Example 5 | (F'-5) | ○ | ○ | ○ | x |
| Comparative Example 6 | (F'-6) | ○ | ○ | x | x |
| Comparative Example 7 | (F'-7) | x | x | ○ | ○ |
| Comparative Example 8 | (F'-8) | x | x | ○ | ○ |
| Comparative Example 9 | (F'-9) | x | x | ○ | ○ |
| Comparative Example 10 | (F'-10) | x | x | ○ | ○ |
| Comparative Example 11 | (F'-11) | ○ | ○ | ○ | x |
| Comparative Example 12 | (F'-12) | ○ | ○ | ○ | x |

Method for Evaluating Ability to Remove Organic Residues

Evaluation of an ability to remove organic residues using the cleaning agents of Examples 6 to 11 and Comparative Examples 5 to 12 was made according to the following procedure:

(1) Washing of Copper-Plated Silicon Wafer

A wafer obtained by performing copper plating on a silicon wafer (made by Advanced Materials Technology Inc., "Cu plated 10000A Wafer," thickness of copper plating=1.0 μm) was cut into a piece 1.5 cm long by 1.5 cm wide. The cut wafer was immersed for 1 minute in a 10% acetic acid aqueous solution, and washed with water.

(2) Preparation of Organic Residue Liquid 0.4 g of benzotriazole, 0.6 g of a hydrogen peroxide solution at a concentration of 30%, and 200 g of water were mixed, and adjusted with chloride so that the pH was about 3.0, thus preparing an organic residue liquid.

(3) Production of Copper Plated Wafer to which Organic Residues Adhere

The copper plated wafer was immersed in the organic residue liquid prepared in (2) for 60 seconds. Then, the wafer was immersed in water for 60 seconds to produce a copper plated wafer to which organic residues adhered.

(4) Check of Amount of Organic Residues Adhering to Copper Plated Wafer

The amount of organic residues adhering to the copper plated wafer was checked by measuring an amount of nitrogen derived from benzotriazole, which was an organic residue product, using an X ray photoelectron spectroscopy (XPS) apparatus (made by ULVAC-PHI, Inc., ESCA-5400 type).

Specifically, using XPS, the number of photoelectrons was measured at a binding energy from 397 eV to 399 eV, and a peak area value at a binding energy from 397.5 to 398.4 eV derived from nitrogen was determined. MgKα rays (1253.6 eV) were used as a soft X ray.

(5) Removal of Organic Residue Adhering to Copper Plated Wafer

In 50 g of each of the second compositions, the copper plated wafer produced in (3) to which organic residues adhered was immersed for 3 minutes to remove the organic residues from the copper plated wafer. Then, the copper plated wafer was immersed in 1 L of water for 60 seconds, and the wafer surface was dried by a nitrogen stream.

(6) Check of Amount of Organic Residues that Remained in Copper Plated Wafer

Similarly to the case of (4), the amount of the organic residues that remained on the copper plated wafer was checked by measuring an amount of nitrogen derived from benzotriazole, which was an organic residue product, using XPS.

(7) Evaluation and Determination of Ability to Remove Organic Residues

Two peak area values measured in (4) and (6) were substituted into the following equation (3), and an organic residue removal rate was calculated:

Equation 3

$$\text{Organic residue removal rate (\%)} = \frac{(Xa - Xb)}{Xa} \times 100$$

wherein, Xa=Peak area value of nitrogen derived from benzotriazole before organic residues are removed; Xb=Peak area value of nitrogen derived from benzotriazole after organic residues are removed An ability to remove organic residues was determined from the calculated organic residue removal rate according to the following criteria:

○: Organic residue removal rate is not less than 90%.
x: Organic residue removal rate is less than 90%.

Method for Evaluating Ability to Remove Abrasive Grains

Evaluation of an ability to remove abrasive grains using the cleaning agents of Examples 6 to 11 and Comparative Examples 5 to 12 was made according to the following procedure:

(1) Washing of Copper Plated Silicon Wafer

A copper plated silicon wafer was washed by the same method as that used in evaluation of an ability to remove organic residues.

(2) Contamination Treatment with CMP Slurry

The washed copper-plated silicon wafer was immersed in a CMP slurry (made by Cabot Corporation, W7000, principal component of the abrasive grains of $SiO_2$, average particle size of 0.2 μm) for 1 minute, and dried by nitrogen blow. The wafer subjected to the contamination treatment was cut into a piece 1.0 cm long by 1.5 cm wide to obtain a sample for evaluation.

(3) Washing with the Second Composition

In 10 g of each of the second compositions, the sample for evaluation obtained in (2) was immersed, and left to stand for 3 minutes at 25° C. Then, the sample for evaluation was extracted from said composition, and dried in nitrogen blow.

(4) SEM Observation of Surface of Evaluation Sample after Washing

The surface of the washed evaluation sample obtained in (3) was observed at a magnification of 10,000 using an SEM (made by Hitachi High-Technologies Corporation, model name S-4800).

(5) Evaluation and Determination of Ability to Remove Abrasive Grains

From the SEM image, it was determined that the ability to remove abrasive grains was higher as the number of residual abrasive grains per visual field was smaller. Specifically, the number of residual abrasive grains per visual field was checked, and determination was made according to the following criteria:

○: Less than 10
□: 10 to 20
x: Not less than 20

Method for Evaluating Ability to Remove Metallic Residues

Evaluation of an ability to remove metallic residues using the cleaning agents of Examples 6 to 11 and Comparative Examples 5 to 12 was performed according to the following procedure:

(1) Pretreatment of Wafer Having Silicon Oxide Single Layer Film

A silicon wafer having a silicon oxide single layer film (made by ADVANTEC Co., Ltd., "P-TEOS 1.5μ", thickness of silicon oxide=1.5 μm.) was cut into a piece 1.0 cm long by 2.0 cm wide, immersed in a 10% acetic acid aqueous solution for 1 minute, and washed with water.

(2) Preparation of Aqueous Solution Containing Metal Ions

Water was added to 0.1 parts of zinc nitrate, 0.1 parts of iron nitrate, and 0.1 parts of magnesium nitrate so that the total amount might be 100 g, thereby to prepare an aqueous solution containing 0.1% metal ions of zinc, 0.1% metal ions of iron, and 0.1% metal ions of magnesium.

(3) Contamination Treatment of Wafer with Metal Ion Aqueous Solution

The pretreated piece of the wafer having a silicon oxide single layer film was immersed in 10 g of the aqueous solution containing metal ions for 1 minute, and dried by nitrogen blow. Thereby, the metal ions were attached to the surface of the wafer.

(4) Washing of Wafer

In 10 g of each of the second compositions, the piece of the contaminated wafer having a silicon oxide single layer film was immersed. After the piece of the wafer was left to stand for 3 minutes at 25° C., the piece of the wafer was extracted from the compositions.

(5) Measurement of Concentration of Metal Ions in Second Compositions from Surface of Wafer 5 g of the composition after the wafer was immersed was collected, and the pH thereof was adjusted to 3.0 with a nitric acid solution. Then, water was added until the total amount reached 10 g, and a measuring liquid was prepared. The concentration of metal ions of zinc, that of iron, and that of magnesium contained in the measuring liquid were measured using an ICP-MS analysis apparatus.

(6) Calculation of Amount of Metal Ions Eluted in Cleaning Agent from Surface of Wafer An amount of ions of each metal eluted was calculated using equation 2.

(7) Evaluation and Determination of Ability to Remove Metallic Residues

An ability to remove metallic residues was evaluated from the total amount of the respective calculated amounts of metal ions eluted, and it was determined that an ability to remove metallic residues was higher as the amount of metal ions eluted per unit area of the wafer was larger. Specifically, an ability to remove metallic residues was determined according to the following criteria:

○: Not less than 15 ng/cm$^2$
□: 10 ng/cm$^2$ to 15 ng/cm$^2$
x: Less than 10 ng/cm$^2$ Method for Evaluating Anticorrosiveness to Copper Wiring Evaluation of anticorrosiveness to the copper wiring using the cleaning agents of Examples 6 to 11 and Comparative Examples 5 to 12 was performed according to the following procedure:

(1) Pretreatment of Wafer Having Copper Single Layer Film

A wafer having a copper single layer film (made by Advanced Materials Technology Inc., a wafer obtained by vapor-depositing a copper metal at a thickness of 2 μm on a silicon substrate) was cut into a piece 1.0 cm long by 2.0 cm wide, immersed in a 10% acetic acid aqueous solution for 1 minute, and washed with water.

(2) Elution of Copper

In 10 g of each of the second compositions, the pretreated piece of the wafer having a copper single layer film was immersed. The piece was left to stand for 3 minutes at 25° C., and removed from the cleaning agent.

(3) Measurement of Copper Ion Concentration 5 g of the second composition after the piece of the wafer having a copper single layer film was immersed was collected, and the pH thereof was adjusted to 3.0 with a nitric acid aqueous solution. Then, water was added until the total amount reached 10 g, and a measuring liquid was prepared. The copper ion concentration in the measuring liquid was measured using an ICP-MS analysis apparatus.

(4) Calculation of Amount of Copper Ions Eluted

The concentration of copper ions was substituted into the following equation (4), and the amount of copper ions eluted (ng/cm$^2$) was calculated:

Equation 4

$$\text{Amount of copper ions eluted } (\mu g/cm^2) = \frac{Cu_{con} \times H1 \times H3}{H2 \times S_{Cu}}$$

wherein, $Cu_{con}$=copper ion concentration in the measuring liquid determined by the ICP-MS analysis (ppb (ng/g)); H1=amount of the second composition in which the test piece is immersed (g); H2=amount of the second composition collected before adjusting the pH (g); H3=amount of the measuring liquid (g); and $S_{Cu}$=area of a copper single layer film in the wafer having a copper single layer film (cm$^2$)

(5) Evaluation and Determination of Anticorrosiveness to Copper Wiring

Anticorrosiveness to the copper wiring was evaluated from the calculated amount of copper ions eluted. It was determined that anticorrosiveness to the copper wiring was better as the amount of copper ions eluted per unit area of the wafer having a copper single layer film was smaller. Specifically, anticorrosiveness to the copper wiring was determined according to the following criteria:
○: Less than 15 ng/cm²
□: 15 ng/cm² to 20 ng/cm²
x: Not less than 10 ng/cm²

As shown in Table 6, the second compositions in Examples 6 to 11 had favorable results in all four evaluated items. On the other hand, in Comparative Example 5 containing no polyphenol based reducing agent having 2 to 5 hydroxyl groups, anticorrosiveness to the copper wiring was poor. In Comparative Example 6 containing no ascorbic acid, an ability to remove metallic residues was poor and anticorrosiveness to the copper wiring was poor. In Comparative Example 7 containing a cyclic polyamine not included in the cyclic polyamine according to the present invention, Comparative Examples 8 and 9 containing a cyclic monoamine instead of the cyclic polyamine, and Comparative Example 10 containing a chain monoamine, an ability to remove organic residues and an ability to remove abrasive grains were all poor. Moreover, in Comparative Example 11 containing a chain polyamine instead of the cyclic polyamine, and Comparative Example 12 containing citric acid instead of the ascorbic acid, anticorrosiveness to the copper wiring was poor.

Industrial Applicability

The compositions for removing material from a microelectronic device comprising metal wiring has an excellent ability to remove abrasive grains derived from a polishing agent and an excellent ability to remove metallic residues on an insulating film, and has excellent anticorrosiveness to the metal wiring. Accordingly, the compositions can be suitably used as a cleaning agent in a post-CMP step in the manufacturing process of the semiconductor in which a metal wiring is formed. Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. A composition comprising a cyclic polyamine, a polyphenol based reducing agent having 2 to 5 hydroxyl groups, a quaternary ammonium hydroxide, ascorbic acid, and water, wherein said composition is useful for the removal of material from a surface of a microelectronic device, wherein said microelectronic device comprises copper or copper alloy wiring, and wherein said cyclic polyamine is selected from the group consisting of N-ethylpiperazine, N-isobutylpiperazine, N-aminomethylpiperazine, N-aminopropylpiperazine, N-hydroxypropylpiperazine, 1,4-dimethylpiperazine, 1,4-diethylpiperazine, 1,4-diisopropylpiperazine, 1,4-dibutylpiperazine, 1-aminomethyl-4-methylpiperazine, 1-hydroxymethyl-4-methylpiperazine, 1-aminoethyl-4-ethylpiperazine, 1-hydroxyethyl-4-ethylpiperazine, 1,4-(bisaminoethyl)piperazine, 1,4-bishydroxyethyl)piperazine, 1,4-(bisaminopropyl)piperazine, 1,4-(bishydroxypropyl)piperazine, 1-aminoethyl-4-hydroxyethylpiperazine, 1-aminopropyl-4-hydroxypropylpiperazine, N-aminoisobutylmorpholine, and combinations thereof.

2. The composition of claim 1, wherein the material comprises post-CMP residue and/or contaminants.

3. The composition according to claim 1, wherein the polyphenol based reducing agent is selected from the group consisting of catechol, caffeic acid, alizarin, endocrocin, urushiol, flavone, resorcinol, hydroquinone, gallic acid, emodin, pyrogallol, quercetin, catechin, and anthocyanin.

4. The composition according to claim 1, wherein the quaternary ammonium hydroxide is a quaternary ammonium hydroxide represented by the following general formula (6)

Formula 6

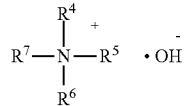

wherein, $R^4$ to $R^7$ each independently represent an alkyl group having 1 to 4 carbon atoms or a hydroxyalkyl group having 1 to 4 carbon atoms.

5. The composition according to claim 4, wherein the quaternary ammonium hydroxide comprises a species selected from the group consisting of tetramethylammonium hydroxide, tetraethylammonium hydroxide, and (hydroxyethyl)trimethylammonium hydroxide.

6. The composition according to claim 1, further comprising at least one corrosion inhibitor.

7. The composition according to claim 6, wherein the corrosion inhibitor comprises at least one species selected from the group consisting of N-ribosylpurine, adenosine, guanosine, 2-aminopurine riboside, 2-methoxyadenosine, N-methyladenosine, N,N-dimethyladenosine, trimethylated adenosine, trimethyl N-methyladenosine, C-4'-methyladenosine, 3-deoxyadenosine, adenine, methylated adenine, dimethylated adenine, N4, N4-dimethylpyrimidine-4,5,6-triamine, 4,5,6-triaminopyrimidine, allantoin, hydroxylated C—O—O—C dimers, C—C bridged dimers, ribose, methylated ribose, tetramethylated ribose, methylated hydrolyzed diribose compounds; xylose, glucose, purine, guanine, hypoxanthine, xanthine, theobromine, caffeine, uric acid, isoguanine, triaminopyrimidine, and combinations thereof.

8. A method of removing post-CMP residue and/or contaminants from a microelectronic device having said residue and contaminants thereon, said method comprising contacting the microelectronic device with a composition for sufficient time to at least partially clean said residue and contaminants from the microelectronic device, wherein the microelectronic device comprises copper or copper alloy wiring, wherein said composition comprises a cyclic polyamine, a polyphenol based reducing agent having 2 to 5 hydroxyl groups, a quaternary ammonium hydroxide, ascorbic acid and water, wherein said cyclic polyamine is selected from the group consisting of N-ethylpiperazine, N-isobutylpiperazine, N-aminomethylpiperazine, N-aminopropylpiperazine, N-hydroxypropylpiperazine, 1,4-dimethylpiperazine, 1,4-diethylpiperazine, 1,4-diisopropylpiperazine, 1,4-dibutylpiperazine, 1-aminomethyl-4-methylpiperazine, 1-hydroxymethyl-4-methylpiperazine, 1-aminoethyl-4-ethylpiperazine, 1-hydroxyethyl-4-ethylpiperazine, 1,4-(bisaminoethyl)piperazine, 1,4-(bishydroxyethyl)piperazine, 1,4-bisaminopropyl)piperazine, 1,4-(bishydroxypropyl)piperazine, 1-amino ethyl-4-hydroxyethylpiperazine, 1-aminopropyl-4-hydroxypropylpiperazine, N-aminoisobutylmorpholine, and combinations thereof.

9. A composition consisting of an organic amine, a quaternary ammonium hydroxide, a chelating agent, and water, having pH in the range of about 7.0 to about 14.0, wherein said organic amine comprises a species selected from the group consisting of ethylenediamine, propylenediamine, trimethylenediamine, tetramethlenediaine, hexamethylenediamine, 2-hydroxethlaminorolamine, diethanolaminopropylamine, diethylenetriamine, triethylenetetramine, tetraethylenepentamine (TEP), hexamethyleneheptamine, iminobispropylamine, bis(hexamethylene)triamine, pentaethylenehexamine, and combinations thereof, wherein the chelating agent comprises a species selected from the group consisting of sodium pyrophosphate, sodium tripolyphosphate, potassium trimetaphosphate, sodium tetrametaphosphate, 1-hydroxyethylidene-1,1-diphosphonic acid, dimethlglyoxime, 8-oxquinoline, phyrin, ethylenediamine diacetate and neutralized products of metal salts thereof (the metal is sodium, and potassium, for example), ethylenediamine tetraacetate (EDTA) and neutralized products of metal salts thereof, hexylenediamine diacetate and neutralized products of metal salts thereof, hydroxyethylimino diacetate and neutralized products of metal salts thereof, trisodium nitrilotriacetate, trisodium hydroxyethylethylenediaminetriacetate (HEDTA), pentasodium diethylenetriaminepentaacetate, hexasodium triethylenetetraminehexaacetate, dihydroxyethyl glycine, glycine, tetrasodium L-glutamate diacetate, oxalic acid, disodium malate, ethylene dicarboxylic acid, adipic acid, sebacic acid, gluconic acid, sodium gluconate, acetylacetone, hexane-2,4-dione, 3-ethylnonane-4,7-dione, sodium polyacrylate, poly[2-hydroxyacrylate sodium], and combinations thereof, and wherein said composition is useful for the removal of material from a surface of a microelectronic device, wherein said microelectronic device comprises tungsten or tungsten alloy wiring.

10. The composition of claim 9, wherein the material comprises post-CMP residue and/or contaminants.

11. The composition according to claim 9, wherein the organic amine is tetraethylenepentamine.

12. The composition of claim 9, wherein the quaternary ammonium hydroxide is a quaternary ammonium hydroxide represented by a following general formula (3):

Formula 3

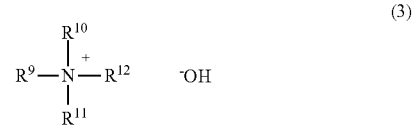

(3)

wherein, $R^9$ to $R^{12}$ each independently represent an alkyl group having 1 to 3 carbon atoms and that may be partially substituted by a hydroxyl group.

13. The composition according to claim 12, wherein the quaternary ammonium hydroxide comprises a species selected from the group consisting of tetramethylammonium hydroxide, tetraethylammonium hydroxide, and (hydroxyethyl)trimethylammonium hydroxide.

14. The composition according to claim 9, wherein the chelating agent is ethylenediamine tetraacetate.

15. A method of removing post-CMP residue and/or contaminants from a microelectronic device having said residue and contaminants thereon, said method comprising contacting the microelectronic device with the composition of claim 9 for sufficient time to at least partially clean said residue and contaminants from the microelectronic device, wherein the microelectronic device comprises tungsten or tungsten alloy wiring.

* * * * *